SWITCHING CIRCUITS EMPLOYING ESAKI DIODES

Filed Oct. 5, 1960 3 Sheets-Sheet 1

INVENTOR
ALGIRDAS J. GRUODIS
BY
Joseph C. Redmond, Jr.
ATTORNEY

Feb. 10, 1970 A. J. GRUODIS 3,495,095

SWITCHING CIRCUITS EMPLOYING ESAKI DIODES

Filed Oct. 5, 1960 3 Sheets-Sheet 3

United States Patent Office 3,495,095
Patented Feb. 10, 1970

3,495,095
SWITCHING CIRCUITS EMPLOYING ESAKI DIODES

Algirdas J. Gruodis, Hyde Park, N.Y., assignor to International Business Machines Corporation, New York, N.Y., a corporation of New York Filed Oct. 5, 1960, Ser. No. 60,593
Int. Cl. H03k 19/40
U.S. Cl. 307—214 25 Claims This invention relates to switching circuits and more particularly to switching circuits employing bistable semiconductor devices.

Switching circuits for information handling equipment should be low in noise level and power consumption, rapid in operation, and insensitive to temperature. Recently, a bistable semiconductor device has been developed which, when employed as the active element in switching circuits, permits all of the previously indicated requirements to be satisfied for such circuits. It is desirable from a design and manufacturing standpoint that a switching circuit emplying the new bistable device, be easily and readily convertible to any one of several different switching purposes. A flexible switching circuit of the type described will permit the circuit to be standardized for a number of different types of information handling equipment with reduced design and manufacturing cost thereof.

A general object of the present invention is an improved switching circuit which is easily adapted for a variety of switching purposes in information handling equipment.

One object of the invention is a high speed switching circuit employing bistable semiconductor devices for polarity inverting operation with automatic reset.

Another object is a compact switching circuit employing bistable semiconductor devices that is easily adapted for either single shot or oscillatory operation.

Still another object is an inexpensive switching circuit employing bistable semiconductor devices which can perform logical switching operations.

These and other objects are accomplished in accordance with this invention, one illustrative embodiment of which comprises at least two bistable semiconductors connected in series relation and having a common junction. An input circuit is connected to one of the devices and an output circuit is connected to the common junction. The bistable devices are biased into the same operating state whereby an input pulse will switch one diode which in turn will switch the other diode to cause an output signal to appear that is the inverse of the input signal.

One feature of the present invention is a set of bistable semiconductor devices biased for bistable operation and connected together in opposed series relation whereby at least two input pulses of like polarity are required to switch the bistable devices to provide an output that is the inverse of the input signals.

Another feature is at least two energy storages devices connected to a set of bistable semiconductor devices for automatic reset of the bistable device on operation thereof.

Still another feature is an input circuit and a power supply of one polarity and suitable magnitude connected at one point to a set of bistable semiconductor devices and a power supply of the other polarity connected to the bistable devices at another point to obtain gated oscillator operation of the bistable devices by the application of a signal to the input circuit.

The foregoing and other objects, features and advantages of the invention will be apparent from the following more particular description of preferred embodiments of the invention, as illustrated in the accompanying drawings, wherein.

Figures 1, 2, 3, 4:
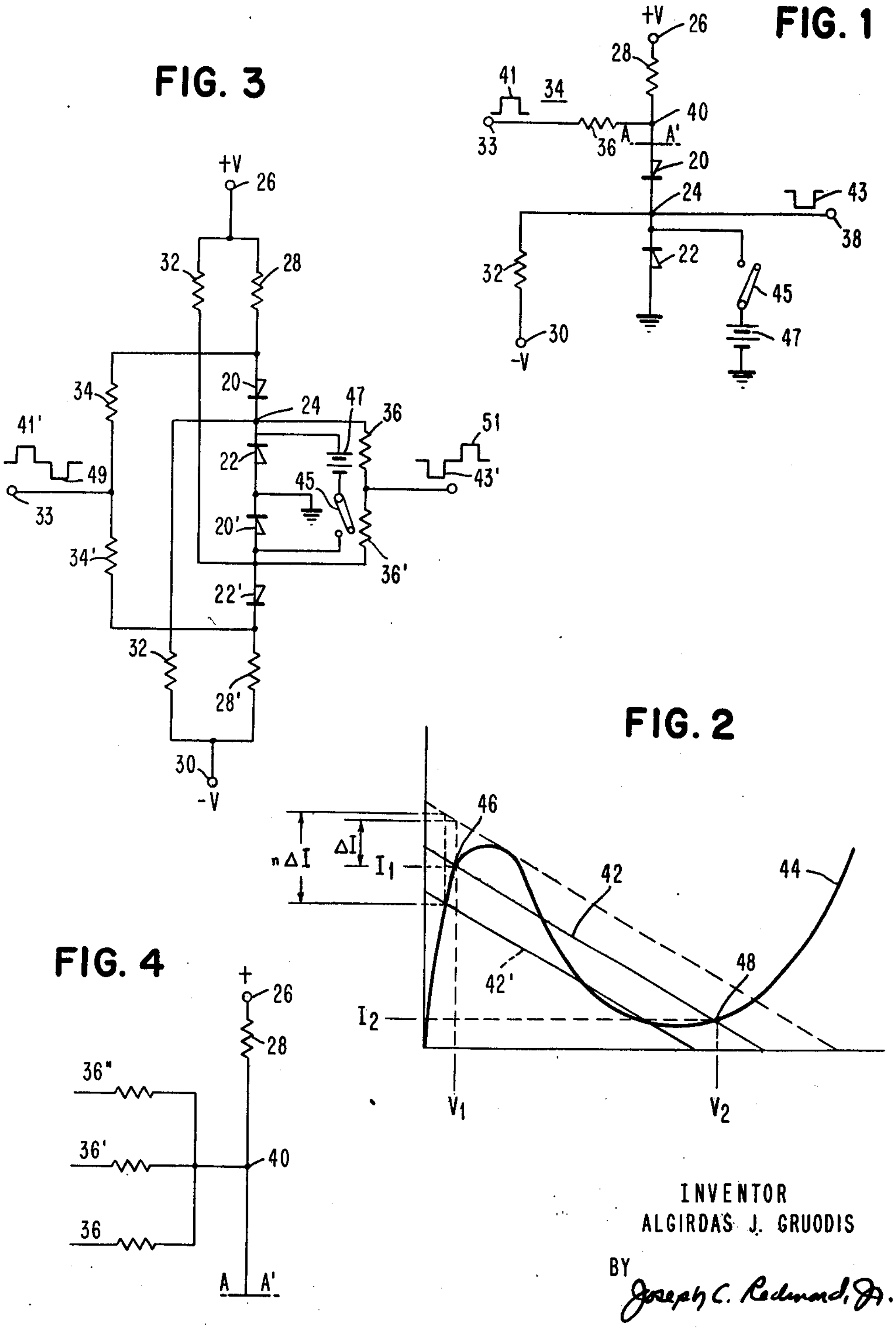
FIG. 1 is an electrical schematic of one embodiment of the invention.
FIG. 2 is a voltage-current characteristic of a preferred bistable semiconductor employed in the invention.
FIG. 3 is a modification of the circuit shown in FIG. 1.
FIG. 4 is another modification of the circuit shown in FIG. 1.

Referring to FIG. 1 an ilustrative embodiment of the present invention comprises a pair of matched bistable semiconductor devices 20 and 22 connected in opposed series relation and having a common junction 24 therebetween, the bistable devices to be described in more detail hereinafter.

The diodes 20 and 22 are biased from a pair of unidirectional power supplies 26 and 30 including resistors 28 and 32, respectively. The power supplies are of suitable magnitude and of opposite polarities with respect to a reference, typically ground. The power supply 26 is of positive polarity and connected to the bistable device 20. Conversely, the power supply 30 is of negative polarity and connected to one end of the bistable device 22, the connection being made at the common junction 24 between the bistable devices. The other end of the bistable device 22 is connected to the reference point. An input circuit 34 including a terminal 33 and a resistor 36 and an output circuit 38 complete the circuitry of the embodiment shown in FIG. 1. The input circuit is connected to the diode 20 at a node 40 between the resistor 28 and the diode 20. The output circuit is connected to both diodes at the common junction 24.

The bistable devices employed in the present invention exist in the art in several forms. One eminently satisfactory device that has been recently developed is described in an article entitled "New Phenomenon in Narrow Germanium PN Junction," Physical Review, vol. 109, 1958, pages 603 and 604 by L. Esaki. The device described in the previously-mentioned publication is commonly referred to as a tunnel or Esaki diode. The tunnel diode has been selected as a preferred element for use in the invention because of the extreme speed of response thereof. Accordingly the remaining paragraphs of the description will be limited to switching circuits employing the characteristics of the tunnel diode, but it should be understood that other bistable semiconductor devices may be employed in the present invention with satisfactory results.

The circuit shown in FIG. 1 is the basic unit of the present invention and as will be seen hereinafter can be easily and readily adapted to perform a variety of switching purposes for information handling equipment. In the unmodified form, the basic circuit operates as a polarity inverter device.

The operation of the circuit will be better understood by referring to FIGS. 1 and 2, the latter disclosing the well known voltage-current characteristics of a tunnel diode. A load line 42 can be drawn on a voltage-current curve 44 for the diodes in accordance with well known circuit principles. The load line is selected to permit bi-stable operation of the diodes at either operating point 46 or 48, the former point being defined as the "0" operating point of the diode and the latter point as the "1" point of the diode. To begin operation of the inverter, the diodes are set in the "0" state or low voltage, high current condition indicated at the point 46. Without any signal to the input circuit both diodes conduct a current $I_1$ which results in a current flow of $2I_1$ through the resistor 32. The voltage across the output circuit is approximately at ground since the voltage across diode 22 is in the "0" or low condition and equal to $V_1$ shown in FIG. 2.

A positive pulse 41 of current $\Delta I$ applied to the input circuit, switches the diode 20 from the "0" state to the "1" state or low current, high voltage condition which decreases the current flow to the junction 24. The voltage at the junction and across the output circuit does not change when the diode 20 switches since it is determined by the voltage across the diode 22 which is still in the "0" state. Current flow, however, increases from the diode 22 to maintain the current $2I_1$ flowing through the resistor 32. The increase in current flow from the diode 22 is sufficient to cause switching thereof to the "1" state. As a consequence, the voltage across the diode 22 increases to that indicated for the operating point 48. Since the anode of the diode is tied to the reference point the cathode goes negative. The output voltage is the same as that across the diode 22 and hence the output voltage increases negatively thereby forming an output pulse 43 which is the inverse of the input pulse 41.

The circuit is reset for the next operation by a reset circuit which may take any one of several forms, a typical circuit including a switch 70 and a series battery 47 connected between the junction 24 and ground. The reset circuit is adapted to supply a positive pulse to the junction when the switch is closed, the positive pulse lowering the voltage across each diode which thereupon return to the "0" operating point ready for the next operation.

A negative pulse within prescribed limits will not operate the circuit shown in FIG. 1 since such a pulse is in the reverse direction of the diode 20. Also a negative pulse lowers the voltage across the diode 20 instead of raising the voltage to switch the diode from the "0" operating point to the "1" operation. If the negative pulse exceeds the prescribed limits, however, the diode 22 will be switched.

The circuit can be adapted to operate on negative pulse by interchanging the power supplies 26 and 30 and connecting the diodes 20 and 22 anode to anode instead of cathode to cathode as shown in FIG. 1. It is believed apparent that the modified circuit will provide positive output pulses which are the inverse of the negative input pulses, the operation of the circuit being similar to that described for positive pulses.

The circuit shown in FIG. 1 may be adapted for bipolar operation by adding another section thereto, as shown in FIG. 3, wherein like elements to those shown in FIG. 1 have the same reference designation. The elements shown in the second section have primed numbers corresponding to those in the first section where the primed element of FIG. 3 performs the same function as the unprimed element of FIG. 1. The first and second sections of the bipolar inverter are coupled together at a common input terminal 33 and a common output terminal 35. Each output circuit also includesa resistor 36 for current flow in the circuit. The reset circuit including the switch 45 and the battery 47 is connected between the junctions 24 and 24', the positive battery terminal being connected to the junction 24 and the negative battery terminal being connected to the junction 24' for reasons more apparent hereinafter.

The bipolar inverter circuit shown in FIG. 3 is biased and operated in a manner similar to that described for FIG. 1. Upon application of a positive pulse 41' to the terminal 33, a negative pulse 43' appears at the output terminal. The positive pulse switches the diode 20 from the "0" state to the "1" state which in turn switches the diode 22 from the "0" state to the "1" state resulting in a negative pulse appearing in the output circuit for the reasons described in connection with FIG. 1. Similarly, a negative signal 49 to the terminal 33 results in a positive pulse 51 appearing at the terminal 43. The negative pulse switches the diode 22' from the "0" state to the "1" state which in turn switches the diode 20' from the "0" state to the "1" state increasing the voltage across the diode thereby providing a positive pulse 51 in the output circuit.

A positive pulse does not operate the inverter section having primed numbers. Nor does a negative pulse operate the inverter section having unprimed numbers. Positive and negative pulses to the primed and unprimed inverter sections, respectively lower the voltage across these sections instead of raising the voltage thereby preventing the diodes from switching as previously explained.

To reset the circuit the switch 45 is closed and the battery reduces the voltage across the operated diodes to return them to the "0" state.

Another modification of the basic circuit shown in FIG. 1 is as either an inverting "AND" or an inverting "OR" circuit. This is accomplished by providing at least two input circuits to the circuit at the node 40, as shown in FIG. 4, instead of the single input circuit 34 shown in FIG. 1. In the case of the inverting "AND," the circuit is biased along a load line 42' (see FIG. 2) instead of along the load line 42. The load line 42' is selected such that the current necessary to switch the diodes from the "0" state to the "1" state is $n\Delta I$ where $n$ equals the number of input circuits. It is believed apparent that the diodes 20 and 22 can not switch, in the manner previously described, unless pulses of like polarity appear at all input circuits. Upon switching the output pulse is the inverse of the input pulses.

In the case of the inverting "OR" the circuit is biased in the manner described for FIG. 1 or along the load line 42. Thus, if a signal occurs on any input circuit the diodes will switch and a pulse that is the inverse of the input pulse will appear in the output circuit.

Figure 5:
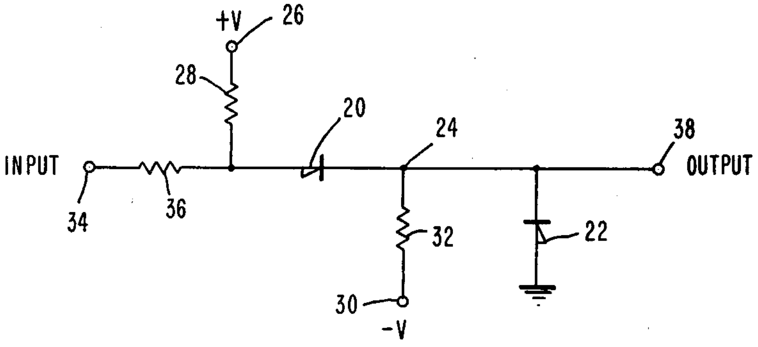
FIG. 5 is an electrical schematic of another embodiment of the invention.
Figure 6:
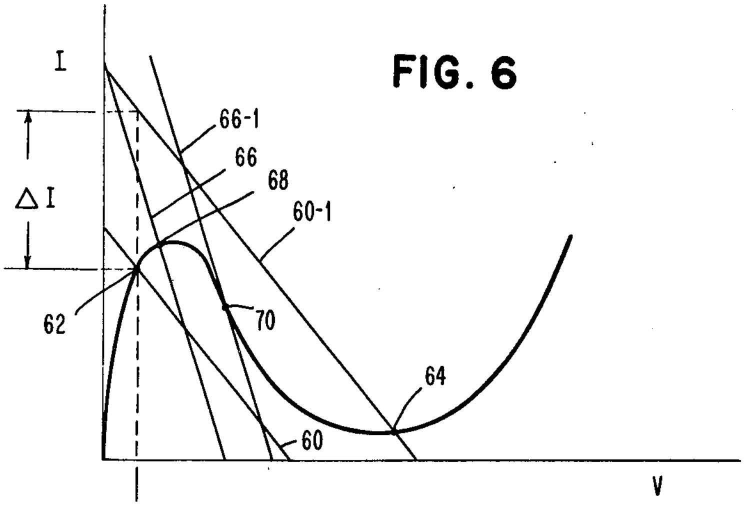
FIG. 6 is a voltage-current characteristic of a preferred bistable semiconductor device employed in the circuit of FIG. 5.

Still another modification of the basic invention is a gated oscillator which is shown in FIG. 5 wherein elements corresponding to those shown in FIG. 1 have the same reference designation. In the case of the circuit shown in FIG. 5, however, the parameters 28, 32, and 36 are selected to bias the diode 20 along a load line 60 as shown in FIG. 6. The load line 60 permits operation of the diode 20 at either a stable operating point 62 in the "0" condition or a stable operating point 64 when a pulse 72 is supplied to switch the diode to the "1" condition. In contrast the parameters 30 and 32 are selected to bias the diode 22 along a load line 66 which permits operating the diode 22 at either a stable operating point 68 in the "0" condition or an unstable operating point 70 when the diode 20 is switched to the "1" condition.

Figure 7:
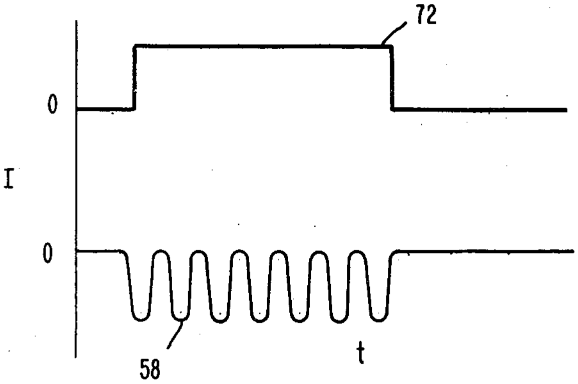
FIG. 7 is a plot of input and output pulses versus time for the circuit of FIG. 5.

Having described the circuitry and biasing of the embodiment shown in FIG. 5, the operation thereof will be described in conjunction with FIGS. 5, 6 and 7.

As in the case of the embodiment shown in FIG. 1, the current through the resistor 32 is the sum of the currents from the diodes 20 and 22 before the pulse 72 is supplied to the input circuit. The pulse 72 switches the diode 20 from the operating point 62 to the operating point 64 indicated on the load line 60–1. The reduced current from the diode 20 increases the current flow from the diode 22, for reasons previously explained, resulting in the diode 22 switching from the operating point 68 to the unstable operating point 70 indicated on the load line 66–1. The voltage across the diode 22 increases negatively and the output pulse is the opposite of the positive input pulse, for reasons previously explained.

Since the operating point 70 is in the negative resistance region of the diode 22, the junction capacitance of the diode and the inductance between the diodes and the node 24 form a tank circuit for the diode which commences to operate as a negative resistance oscillator. As a consequence a series of negative pulses 58 (see FIG. 7) appear in the output circuit so long as the pulse 72 is applied to the input circuit. The pulse shape and repetition rate is dependent upon the capacitance of the diode 22 and the inductance in the line between the resistor 32 and the diode 22. Laboratory experience has indicated that frequencies of the order of 500 megacycles are obtainable with the circuit shown in FIG. 5.

As the diode 22 oscillates, the diode 20 remains in the stable state because of the magnitude of the input pulse 72 which is selected to maintain a current across the diode no less than ΔI indicated in FIG. 6. Upon removal of the pulse 72 the diodes 20 and 22 return to the stable operating point 62 and 68, respectively and the output pulses terminate.

Figure 8:
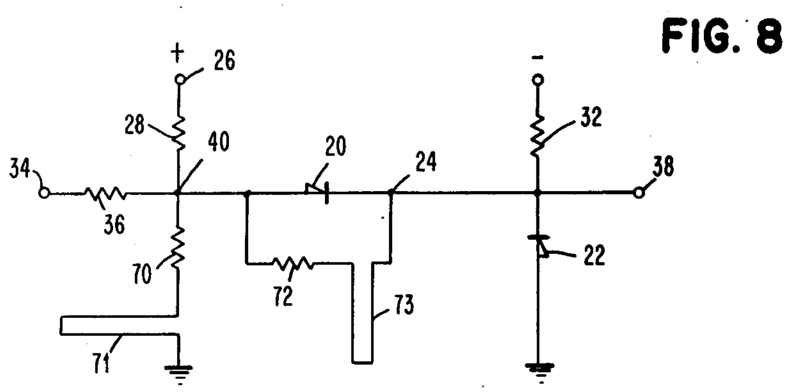
FIG. 8 is an electrical schematic of another embodiment of the invention.
Figure 9:
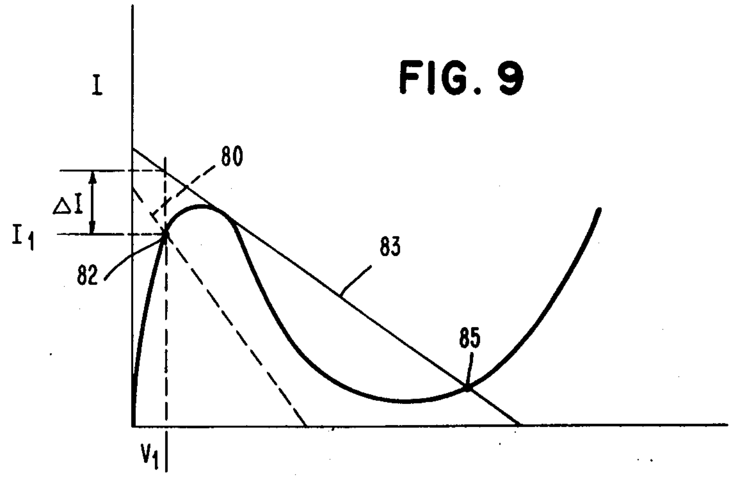
FIG. 9 is a voltage-current characteristic of a preferred bistable semiconductor device employed in the circuit of FIG. 8.

Another modification of the basic invention is a short pulse inverter having automatic resetting which is shown in FIG. 8. Again, elements corresponding to those described in FIG. 1 have like reference designations. The circuit of FIG. 1 is converted to an inverter having short output pulses by connecting a resistor 70 and a first transmission or delay line 71 between the node 40 and the reference potential. A resistor 72 and a second transmission or delay line 73 are connected across the diode 20 and between the nodes 24 and 40. As shown in FIG. 9, both diodes are normally biased along a load line 80 for monostable operation at an operating point 82. For input pulses of magnitude ΔI, the diodes are adapted to switch from the load line 80 to a new load line 83 which is principally determined from the AC impedance of the transmission lines.

Figure 10:
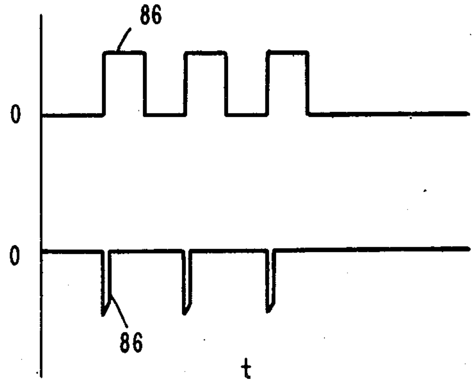
FIG. 10 is a plot of input and output pulses versus time for the circuit of FIG. 8.

Having described the structure and biasing of the circuit shown in FIG. 8, the operation thereof will be described in conjunction with FIGS. 8, 9 and 10.

In the absence of an input pulse, the circuit conditions are the same as those described for FIG. 1, that is the diodes 20 and 22 each conduct a current $I_1$ and current $2I_1$ flows through the resistor 32. A pulse 86 (see FIG. 10) applied to the circuit is distributed to the diode 20 and the transmission line 71. The pulse current is sufficient to switch the diode 20 from the stable operating point 82 to an operating point 85 on the load line 83. The switching of the diode produces a pulse at the input of the transmission line and reduces the current flow to the resistor 32. Again, the current flow from the diode 22 increases switching the diode from the stable operating point 82 to the high voltage state thereof. Switching of the diode 22 results in a negative pulse 87 appearing across the output circuit for the same reasons previously described.

At this point the pulse in the transmission line 71 reappears to short-circuit the input pulse 86 to ground through the resistor 70, the input pulse remaining short-circuited until the removal thereof. Thereafter, the pulse in the transmission line 73 reappears to short-circuit the transmission line 73 and decrease the current flow in the diode 20 below that indicated for the operating point 85. Reducing the current below that indicated for the operating point 85 switches the diode 20 back to the operating point 82. As a consequence current to the resistor 32 increases from the diode 20 and through the resistor 72 and decreases from the diode 22 which switches back to the operating point 82. Thereupon, the output pulse terminates, the width of the output pulse being controlled by the length of the transmission line 73 which may be selected to provide output pulse widths of less than two millimicroseconds with present day diodes. Although the invention has shown transmission lines for controlling the pulse width and resetting the diodes, it has been found that any of several types of energy storage devices e.g. an inductor may be employed in the practice thereof. Transmission lines have been selected solely for reasons of convenienece in explanation of the invention.

On removal of the input pulse 86, a small negative pulse appears at the node 40 from the changing current in the transmission line 71. The negative pulse, however, is not of sufficient magnitude to switch the diode 22.

Hence, the present invention has disclosed a basic circuit which can be easily adapted to perform a variety of switching functions for information handling apparatus. The tunnel diode can be manufactured on a mass production basis at relatively low cost and when combined with the other circuit elements will permit the manufacture of an inexpensive switching circuit for standardized manufacture.

While the invention has been particularly shown and described with references to preferred embodiments thereof, it will be understood by those skilled in the art that various changes in form and details may be made therein without departing from the spirit and scope of the invention.

What is claimed is:

1. A switching circuit comprising at least two matched two-terminal negative resistance semiconductor devices connected in series opposed relation, an input circuit connected to one of the two-terminal negative resistance devices, means connected to both devices for permitting one two-terminal negative resistance device to switch the other two-terminal negative resistance device when a signal of preselected polarity and magnitude is applied to the input circuit, and an output circuit connected between the two-terminal negative resistance devices for polarity reversal of the preselected signal applied to the input circuit.

2. A switching circuit comprising at least two matched negative resistance semiconductor devices connected in opposed series relation and having a common junction, an input circuit connected to one of the negative resistance devices, means connected to both devices for permitting one negative resistance device to switch on and turn on the other bistable device when an input signal of preselected polarity and magnitude is applied to the input circuit, and an output circuit connected between the common junction to provide polarity reversal of the preselected signal applied to the input circuit.

3. A switching circuit comprising at least two matched negative resistance semiconductor devices connected in opposed series relation and having a common junction, an input circuit connected to one of said negative resistance devices, biasing means including a power supply of one polarity connected to one negative resistance device and a power supply of opposite polarity connected to a reference point through the other negative resistance device, said biasing means adapted to permit one bistable device to switch on and turn on the other bistable device when an input signal of preselected magnitude and polarity is supplied to the input circuit and an output circuit connected to the common junction.

4. A switching circuit comprising at least two matched sets of negative resistance semiconductor devices, each set of negative resistance semiconductor devices being connected in opposed series relation and having a common junction, an input circuit connected to each set of negative resistance devices, biasing means connected to each set of negative resistance devices, each biasing means permitting one negative resistance device of a set to switch on and turn on the other negative resistance device when a signal of preselected polarity and magnitude is applied to the input circuit associated with the set of negative resistance devices, a signal of positive polarity adapted to operate one set of negative resistance devices and a signal of negative polarity adapted to operate the other set of negative resistance devices and an output circuit connected to each set of negative resistance devices, said output circuit providing negative output signals for positive input signals operating the other set of negative resistance devices supplied to the input circuit.

5. A switching circuit comprising at least two matched sets of negative resistance semiconductor devices, each set including at least two negative resistance devices connected in opposed series relation and having a common junction, said sets being connected together and to a reference potential, a power supply of one polarity being connected to the common junction of one set of negative resistance devices, a power supply of opposite polarity being connected to the common junction of the other set of negative resistance devices, an input circuit connected across both sets of negative resistance devices, means adapted to permit one negative resistance device of a set to switch on and turn on the other negative resistance devices when a signal of preselected polarity and magnitude is applied to the input circuit and an output connected to both sets of negative resistance devices.

6. A switching circuit comprising at least two matched negative resistance semiconductor devices employing tunnelling phenomena being connected in opposed series relation and having a common junction, a plurality of input circuits connected to one of the negative resistance devices, means connected to the common junctions for permitting one negative resistance device to switch on and turn on the other negative resistance device when corresponding signals of preselected polarity and magnitude are applied to all of the input circuits, and an output circuit connected between the negative resistance devices for providing output signals when signals are applied to all of the input circuits, said output signals being of opposite polarity to those supplied to the input circuits.

7. A switching circuit comprising at least two matched negative resistance semiconductor devices employing tunnelling phenomena being connected in opposed series relation and having a common junction, at least two input circuits connected to one of the negative resistance devices, means including a current source connected to the common junction for permitting one negative resistance device to switch on and turn on the other negative resistance device when a signal of preselected polarity and magnitude is applied to any one of the input circuits, and an output circuit connected to the common junction to provide output signals of opposite polarity to that of the preselected signal applied to the input circuit.

8. A switching circuit comprising at least two negative resistance semiconductor devices connected in series relation, an input circuit connected to one of the negative resistance devices, means for biasing one negative resistance device for negative resistance operation and the other negative resistance device for monostable operation, and an output circuit connected to both negative resistance devices, whereby an input signal of preselected polarity and magnitudes switches the one negative resistance device from one stable operating condition to the other stable operating condition thereby switching the other negative resistance device into an oscillating condition of opposite polarity to the preselected signal so long as the preselected signal is supplied to the input circuit.

9. A switching circuit comprising at least two negative resistance semiconductor devices connected in opposed series relation and having a common junction, an input circuit connected to one of the negative resistance devices, means connected to both negative resistance devices for biasing both negative resistance devices for monostable operation, means connected to one negative resistance device for short-circuiting the one negative resistance device at preselected intervals after the application of a preselected signal to the input circuit, and an output circuit connected to the negative resistance devices for providing output pulse signals of opposite polarity to the preselected signal applied to the input circuit.

10. A switching circuit comprising at least two negative resistance semiconductor devices connected in series relation and having a common junction therebetween, an input circuit connected to one of the negative resistance devices, means for biasing both negative resistance devices for monostable operation, a reference potential, a first delay line connected to the reference potential and one of the negative resistance devices, a second delay line connected in parallel with the one negative resistance device, and an output circuit connected to the common junction.

11. A switching circuit comprising at least two tunnel diodes connected in series opposed relation and having a common junction therebetween, means biasing the tunnel diodes for operation in the same one of two operating states, a current source connected to the common junction, an output circuit connected to the common junction, and an input circuit connected to one tunnel diode whereby an input signal of preselected polarity will switch the one tunnel diode to the second operating state and reduce current flow to the current source so that the other tunnel diode will switch to the second operating state and restore the proper current flow to the current source and in so doing provide an output signal to the output circuit whereby the output signal is the inverse of the input signal.

12. A single shot switching circuit comprising at least two tunnel diodes connected in series opposed relation and having a common junction therebetween, means biasing the tunnel diodes for operation in the same one of two operating states, a current source connected to the common junction, an output circuit connected to the common junction, a first transmission line and series impedance connected in parallel with one tunnel diode and an input circuit including a second transmission line connected to the one tunnel diode whereby an input signal of preselected polarity will switch the one tunnel diode to the second operating state and cause the second tunnel diode to switch to the second operating state and in so doing provide an output signal that is the inverse of the input signal and of less time duration thereof due to the first transmission line resetting the first tunnel diode which in turn resets the second tunnel diode and the second transmission line short circuiting the application of the input signal to the one tunnel diode.

13. A gated oscillator comprising at least two tunnel diodes connected in series opposed relation and having a common junction therebetween, means biasing the tunnel diodes for operation in the same one of two operating states but along different load lines, a current source connected to the common junction, an output circuit connected to the common junction and input circuit means connected to one tunnel diode whereby an input signal of preselected polarity will switch the one tunnel diode to a second operating point which is stable and in so doing switch the second tunnel diode to a second operating point which is unstable, the second tunnel diode providing an output signal to the output circuit whereby the output signal is the inverse of the input signal and at a frequency of the order of hundreds of megacycles.

14. A tunnel diode circuit comprising
two oppositely poled tunnel diodes connected in series,
means to bias said diodes for operation in the same one of their two operating voltage states,
means to apply an input signal across the series combination of said diodes, whereby said diodes are switched, and
means to derive an output signal from the junction between said diodes.

15. A tunnel diode circuit comprising
two oppositely poled tunnel diodes connected in series,
means to bias said diodes for operation in the same one of their two operating voltage states, means to apply an input pulse across the series combination of said diodes, whereby said diodes are switched to their same other voltage states, and means to derive an output signal from across one of the diodes.

16. A circuit comprising two oppositely poled negative resistance diodes connected in series, means to bias said diodes for operation in the same one of their two operating voltage states, means to apply an input signal across the series combination of said diodes, whereby said diodes are switched, and means to derive an output signal from across one of the diodes.

17. A directional negative resistance diode circuit comprising first and second oppositely poled diodes connected in series, means to connect a bias source to the junction between said diodes, means to connect a bias source to the other end of said first diode, means to apply an input signal across the series combination of said diodes, and means to derive an output signal from across one of said diodes.

18. A directional tunnel diode circuit comprising first and second oppositely poled tunnel diodes connected in series, means to connect one bias source to supply a bias current to the junction between said diodes, means to connect another bias source to the other end of said first diode to supply a bias current serially through both diodes, means to apply an input signal across the series combination of said diodes, and means to derive an output signal from across one of said diodes.

19. A directional tunnel diode circuit comprising first and second oppositely poled tunnel diodes connected in series, means to connect one bias source to supply a bias current to the junction between said diodes, means to connect another bias source to the other end of said first diode to supply a bias current serially through both diodes.

means to apply an input pulse across the series combination of said diodes, and means to derive an output pulse from across one of said diodes.

20. A directional tunnel diode circuit comprising two oppositely poled tunnel diodes connected in series, means to quiescently bias said diodes for operation in the same one of two voltage states, whereby the voltage across both diodes is substantially zero due to cancellation of equal and opposite voltages, means to apply an input pulse across said series-connected diodes to cause one of the diodes to change its voltage state and consequently cause the other diode to change its voltage state, whereby the voltage across both of said diodes is again substantially zero due to cancellation of equal and opposite voltages, and means to derive an output pulse from across one of said diodes.

21. A directional tunnel diode circuit comprising two-oppositely poled tunnel diodes connected in series, means to quiescently bias both of said diodes for operation in their low voltage states, means to apply an input pulse across both of said series-connected diodes to cause one of the diodes to switch to its high voltage state and consequently cause the other diode to switch to its high voltage state, whereby the voltage across said diodes is substantially zero due to cancellation of equal and opposite voltages, and means to derive an output from across one of said diodes.

22. A directional tunnel diode circuit comprising two oppositely-poled tunnel diodes connected in series, means to quiescently bias said diodes in the same one of two voltage states for monostable operation, means to apply an input pulse across said series-connected diodes to cause them to switch to the other one of their voltage states for a given period of time and then return to their original voltage states, whereby the voltage across said diodes is always substantially zero due to cancellation of equal and opposite voltages, and means to derive an output pulse from across one of said diodes.

23. An inverter circuit comprising two oppositely-poled tunnel diodes connected in series, means to apply an input pulse across both of said diodes in a polarity to make one of said diodes switch, whereby said other diode also is caused to switch, and means to derive an opposite polarity pulse from across said other diode.

24. An inverter circuit comprising two oppositely-poled tunnel diodes connected in series, means to bias said diodes for operation in one of their two operating voltage states, means to apply an input pulse across both of said diodes in a polarity to make one of said diodes switch, whereby said other diode also is caused to switch, and means to derive an opposite polarity pulse from across said other diode.

25. An inverter circuit comprising two oppositely-poled tunnel diodes connected in series, a first bias means connected across both of said diodes in series, a second bias means connected to the junction between said diodes, means to apply an input pulse across both of said diodes in a polarity to make one of said diodes switch, whereby said other diode also is caused to switch, and means to derive an opposite polarity pulse from across said other diode.

References Cited

UNITED STATES PATENTS

| | | | |
|---|---|---|---|
| 2,966,599 | 12/1960 | Hass | 307—206 |
| 2,864,007 | 12/1958 | Clapper | 307—88.5 |
| 2,985,774 | 5/1961 | Carbone et al. | 328—118 |
| 2,986,724 | 5/1961 | Jaeger | 307—88.5 |
| 3,056,048 | 9/1962 | McGrogan | 307—88.5 |
| 3,142,768 | 7/1964 | Kaufman | 307—88.5 |

FOREIGN PATENTS

| | | |
|---|---|---|
| 1,179,248 | 5/1959 | France. |

OTHER REFERENCES

Tunnel-Diode Digital Circuitry, pp. 32–33.
Esaki Tunnel-Diode Logic Circuits, pp. 16–17.

DONALD D. FORRER, Primary Examiner

B. P. DAVIS, Assistant Examiner

U.S. Cl. X.R.

307—274, 258, 286, 322

PO-1050
(5/69)

UNITED STATES PATENT OFFICE
CERTIFICATE OF CORRECTION

Patent No. 3,495,095 Dated February 10, 1970

Inventor(s) A. J. Gruodis

It is certified that error appears in the above-identified patent and that said Letters Patent are hereby corrected as shown below:

Column 1, Line 62 delete "s" on storages.

Column 2, Line 27 delete "ilustrative" and insert --illustrative--

Column 6, Line 45 "bistable" should be --negative resistance--

Column 6, Line 58 "bistable" should be --negative resistance--

Column 6, Line 59 "bistable" should be --negative resistance--

Column 7, Line 21 After "output" should be --circuit--

Column 10, Line 42 delete "s" on diodes

Signed and sealed this 30th day of March 1971.

(SEAL)
Attest:

EDWARD M.FLETCHER,JR.
Attesting Officer

WILLIAM E. SCHUYLER, JR.
Commissioner of Patents